Feb. 7, 1956 C. WASMANSDORFF 2,734,175

TUNABLE UNIT FOR RADIO APPARATUS

Filed Jan. 13, 1949 2 Sheets-Sheet 1

Inventor:
Carlton Wasmansdorff

By Homer R. Montague
ATTORNEY

Feb. 7, 1956 C. WASMANSDORFF 2,734,175

TUNABLE UNIT FOR RADIO APPARATUS

Filed Jan. 13, 1949 2 Sheets-Sheet 2

Inventor:
Carlton Wasmansdorff

By Homer R. Montague
ATTORNEY

United States Patent Office 2,734,175

Patented Feb. 7, 1956

2,734,175

TUNABLE UNIT FOR RADIO APPARATUS

Carlton Wasmansdorff, Los Angeles, Calif., assignor, by mesne assignments, to Standard Coil Products Co. Inc., a corporation of Illinois Application January 13, 1949, Serial No. 70,747

20 Claims. (Cl. 333—82)

Figure 1:
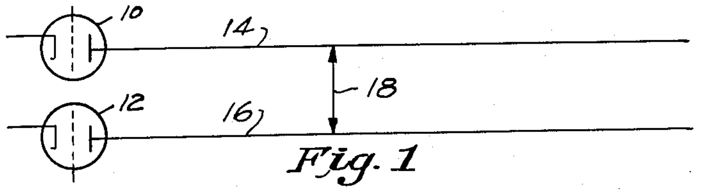

This invention relates to tuning units, and has for its principal object the provision of a radio frequency tuning unit characterized by high versatility and flexibility of application, but which is mechanically very simple and which can therefore be manufactured at reduced cost as compared with other types of units providing the same circuit features.

A further object of the invention is to provide a very wide-range tuner unit providing inherent band-spread characteristics at selected portions of the range thereof, and which is therefore particularly adapted to the tuning of oscillator mixer and radio frequency circuits of television receiving apparatus, in order to provide rapid switching of such circuits to select the desired station band, combined with a desired degree of fine adjustment within the selected band.

Still another object of the invention is to provide a tuning unit of the above type in which a continuous motion of a simple contactor or the like accomplishes both the switching function to achieve large changes in resonant frequency of the unit, and also the fine adjustment of resonant frequency, the parts being designed in such a way that the variation in resonant frequency with changes in angular position of the manual control can be individually controlled by the designer so as to present an optimum characteristic at each portion of the complete range.

Another and very important object of the invention is to provide a tuning unit of the above described type which is mechanically suited to mass production methods in that the principal parts which determine the frequency characteristic of the device may be stamped, printed or otherwise fabricated to very close tolerances, so as to require a minimum of individual adjustment of the units to ensure their interchangeability in the apparatus with which they are to be used or assembled.

For purposes of illustration, the problem of providing a tuning unit for a television receiver of generally conventional construction may be taken as an example of the simplification which may be obtained in accordance with the principles of the present invention. The thirteen authorized television channels covered by present-day television standards have the following frequency limits:

| Channel # | Limits (megacycles) | Channel # | Limits (megacycles) |
|---|---|---|---|
| 1 | 44–50 | 7 | 174–180 |
| 2 | 54–60 | 8 | 180–186 |
| 3 | 60–66 | 9 | 186–192 |
| 4 | 66–72 | 10 | 192–198 |
| 5 | 76–82 | 11 | 198–204 |
| 6 | 82–88 | 12 | 204–210 |
| | | 13 | 210–216 |

It will be observed that channels 1 to 6 lie generally within a lower frequency range than do the remaining channels, so that the provision of a single uni-controlled band switch requires a moderate degree of variation in resonant frequency from channel to channel in the lower range, and a moderate degree of variation from channel to channel in the upper range. Common practice is to provide a double series of thirteen tuning coils (or loops at the higher frequencies) corresponding to the center frequency of each channel, and then to switch them in succession into the tuned circuits by a rotary type of switch having an arm passing over successive contacts to which the coils or loops are connected. Two sets of thirteen coils are thus required for the tuning of the usual push-pull local oscillator, a third and fourth set of thirteen coils is required to tune the radio frequency stage or stages, and a fifth and sixth set are used to tune the heterodyne mixer stage. Thus a total of the order of 78 contacts is required. The assembly of such a unit is an extremely laborious and critical operation, requiring many soldered connections and much adjustment in order to provide completed units which will operate successfully when installed in the receiver.

In accordance with the present invention, the tuning of the circuits through the higher frequency portion of the tuning range is accomplished by a simultaneous controlled variation in the inductance and capacitance defined by a pair of properly shaped and positioned plates acting as a tuned transmission line, the portion thereof introduced in the circuit being controlled by the motion of a rotatable shorting bar or contact or the like; the variation required in moving from channel to channel of the lower portion of the complete range is achieved by a further motion of the same shorting bar over an extension of the transmission line which is divided into small sections separated from one another by lumped inductance, this lumped inductance being provided by a simple mechanical arrangement eliminating the need for separate coils and connections therefor.

Still another object of the invention is to provide improved methods of coupling the resonant circuit established by the above arrangement to the desired utilization device or circuit, and whose "Q" or ratio of inductive reactance to resistance may readily be controlled to ensure the desired breadth of transmission of frequencies in each channel.

An ancillary object of the invention is to provide a unit of the above type which is inherently capable of a high degree of mechanical ruggedness, to resist shock and to eliminate any possibility of microphonic effects attendant upon vibration of the loosely wound coils of prior constructions referred to above. Also, since prior constructions are constructed essentially about the notion of using a switch to insert various coils into the circuit, their practical embodiments have required the use of a large number of contact buttons or the like separated from one another as by mounting upon an insulating plate, the assembly of which is in itself an expensive matter in terms of time and effort, besides presenting numerous possibilities of low insulation-resistance where the by-products of soldering operations partially short between the contact buttons.

A preferred embodiment of the present invention arranges a single slidable shorting bar for contact with the outer periphery of each pair of conductors forming the modified transmission line, so that the contacting surfaces are readily accessible for inspection and cleaning where necessary. However, it is to be understood that the slidable shorting bar may operate to contact lateral edges of the periphery of each pair of conductors, and in the case where this contact is made upon the inner and mutually facing edges, a very compact arrangement can be achieved in which the rotatable shorting bar rotates between the planes of the two conductors. This and similar modifications in mechanical arrangement are intended to fall within the scope of the invention.

While the above discussion of the principal objects of the invention has been directed most especially to a television tuning arrangement, it will be understood that this exemplification has been chosen for purposes of illustration, and the same principles may be applied to tuning units for other purposes, such as band switching filters or the like, signal generators, transmitter tuning units and numerous other applications in part obvious to those skilled in the art and in part referred to more specifically below.

Figure 2:
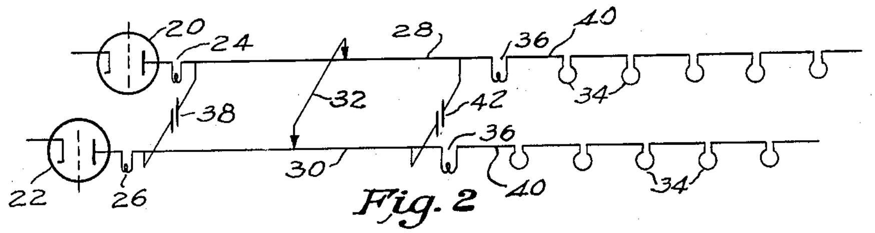
Figures 3, 5:
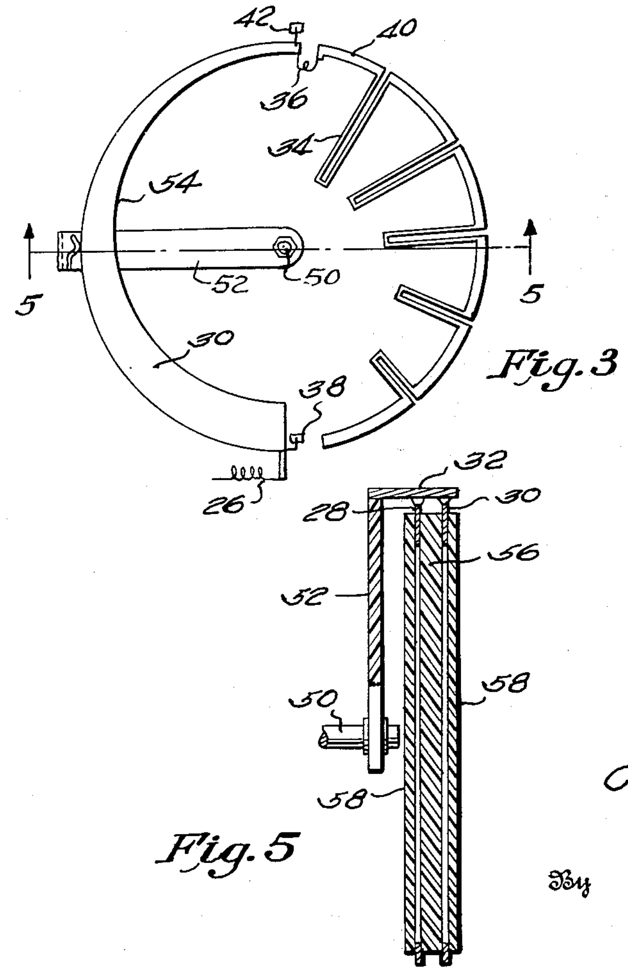
Figure 4:
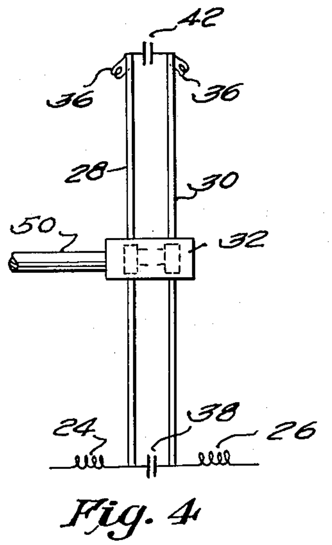
Figure 6:
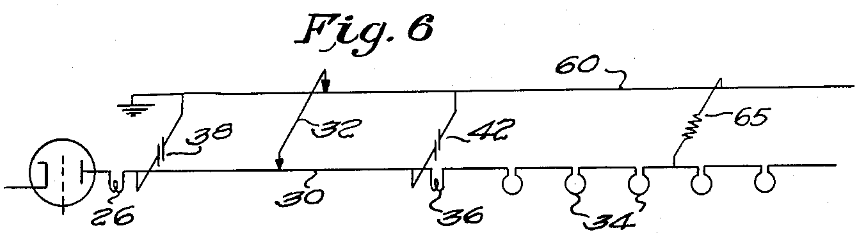
Figure 7:
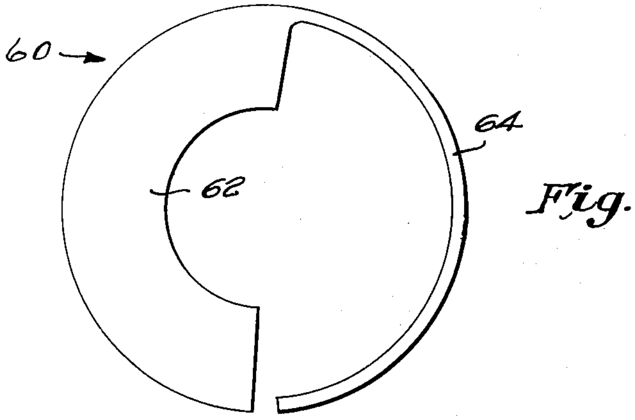
Figure 8:
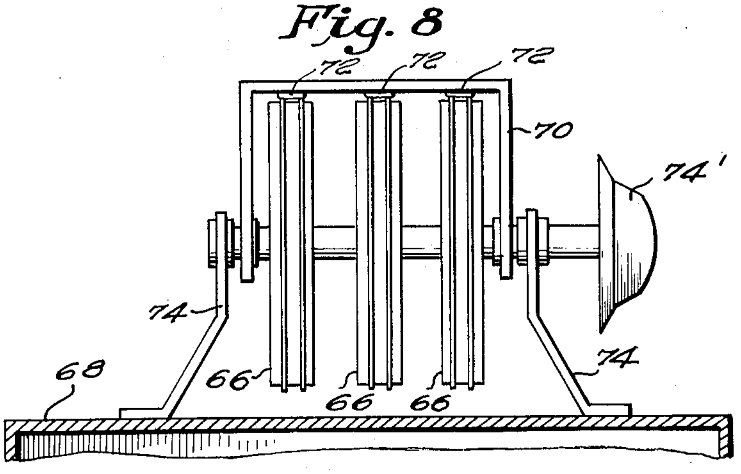

The principles of the invention will best be understood by referring to the following detailed description of the particular application thereof to a tuning unit for television receivers, taken in connection with the appended drawings, in which:

Fig. 1 is a schematic diagram of a variable frequency resonant line of the parallel conductor type, sometimes referred to as a lecher line, Fig. 2 is a similar schematic view of a modified line incorporating lumped inductance and capacitance to provide for large changes in tuning required when changing channels, Fig. 3 is a schematic representation of a mechanical arrangement of the Fig. 2 type, but with the components oriented in circular formation, Fig. 4 is a side view of the arrangement of Fig. 3, Fig. 5 is an elevational view, partly broken away, taken on line 5—5 of Fig. 3, Fig. 6 is a schematic view of a modification of the invention for single-ended operation, Fig. 7 is a plan view of one form of ground plate useful in connection with the invention, and Fig. 8 is a side elevation of a complete tuning unit employing three elements of the type shown in Fig. 5.

Referring now to Fig. 1 of the drawings, there is illustrated schematically a pair of vacuum tubes 10, 12 which may constitute a radio frequency amplifier stage, oscillator stage or equivalent, the plates of these tubes being connected to a pair of parallel conductors 14, 16 which therefore constitute a parallel line fed from the tubes. A slidable shorting bar 18 may be moved along this line to short circuit the same at any desired distance from the plates of tubes 10 and 12, the whole system constituting a tunable lecher wire by the adjustment of which the transmission line circuit may be tuned to resonate at any desired frequency within limits imposed by the characteristics of tubes 10 and 12, the diameters and mutual spacing of lines 14, 16, the position of slider 18, and the stray capacitance associated with the tubes and the conductors. In any event, within such limits, the lecher wire system provides a convenient means for varying the resonant circuit characteristics of the complete amplifier, oscillator or other circuit to which it is connected.

Fig. 2 of the drawings is an expansion of the arrangement of Fig. 1 illustrating a tunable transmission line according to the invention in which lumped inductance and capacitance have been provided at certain points, both to control the over-all tuning range of the line, and to suppress certain regions of such range of resonant frequency for the purpose of permitting an expansion of certain other regions. In the absence of such lumped circuit elements, the natural frequency of the tuned line would be at a maximum when the slider was at the point nearest to the plates of vacuum tubes 20 and 22. Therefore, for the purpose of setting an upper limit to the possible range of frequency, a small inductance 24 and 26 may be inserted in series with each of the lines 28 and 30 at a point relatively closely adjacent to the vacuum tube plates (at the leftmost extremity of the tuned line), and so long as the slider 32 remains to the right of this point, the natural frequency of the line cannot exceed the value determined by the inductance of elements 24 and 26. Thus, if these elements are made adjustable, they may be used to set the maximum frequency of the vacuum tube stage to any desired value.

Where, as in a television receiver, it is necessary to be able to vary the tuning over a wide range (e. g., from about 50 to about 216 megacycles), and still provide reasonable movement of the sliding shorting bar to enable fine tuning in various parts of the range, the physical length of a simple lecher wire transmission tuning line would become very large; in particular, due to the second power law relating frequency with circuit inductance, the change in length of line to achieve a given change in frequency becomes very large at the lower frequency end of the range under consideration. Referring again to the tabulation of television channel frequencies, it will be seen that to cover the six lower frequency bands, the change in frequency is 44 megacycles, or 100% of the value at the lowest frequency of this range, while the change in frequency necessary to encompass the 7 higher frequency channels is 42 megacycles, or only about 25% of the value at the lowest frequency of this portion of the range. Taken together, these considerations mean that the required variation of inductance for covering the high frequency channels may be obtained by a relatively small variation in the inductance of the tuned line, while the change in inductance required to cover the lower frequency channels is comparatively very large, and that if a simple parallel line tuning system were used, this range of inductance would also involve a very large amount of motion of the sliding contact bar 32. However, for television tuning purposes, the amount of adjustment of the radio frequency, oscillator and mixer stages for optimum reception on any one channel need be only a very small amount, sufficient to vary the natural frequencies of the circuits by amounts of the order of one megacycle or less. Thus, in accordance with the present invention, that portion of the parallel tuning line corresponding to the low frequency channels is provided with lumped inductances at points so spaced as to cause the tuned frequency to jump or "skip" over the unwanted portions of the range, leaving the line between such lumped inductances in its original form so as to provide a smooth variation of frequency over a relatively narrow range (generally less than one megacycle) about the proper point in each of the desired bands.

The above situation is schematically shown in Fig. 2, in which a substantial portion (approximately half of the physical length) of the line 28—30 to the right of inductances 24 and 26 is left unchanged to cover the variation in frequency necessary for the high frequency channels, while the remainder of the line consists of straight sections separated by lumped inductances 34 which will be "skipped over" by the slider 32 as it moves toward the low frequency end of the line. Also, in order to provide for a complete skip of the rather wide frequency gap existing between channel 6 and channel 7, a relatively larger lumped inductance 36 is inserted in each line at a point between the end corresponding to the high frequency range and the commencement of the low frequency range. The value of this inductance 36, which may be slightly adjustable for purpose of accurate alignment, thus limits the maximum value of resonant frequency for the low frequency portion of the total range.

The above description has considered an idealized situation in which the change in frequency has been attributed entirely to the variation in mutual inductance of the conductors 28 and 30 as the slider 32 moves along them. Actually, of course, there is a certain amount of capacitance between such lines, which increases as the slider is moved to the right in Fig. 2. This increase in capacitance acts to increase progressively the effective length of the line as the slider moves to the right, that is, to increase the variation in natural frequency for a given physical movement of the slider 32. In order to provide substantially the same amount of physical movement of the slider for each of the (equal width) channels in the high frequency range, it is necessary for the rate of increase of capacitance between the lines to lessen as the slider moves to the right, which can be accomplished by replacing the simple wires of Fig. 2 by parallel plates or bars the width of each of which tapers downwardly toward the right, in a manner to be described more fully below in connection with a diagram of one preferred form of construction. Also, in order to set a lower limit to the natural frequency obtained when the slider is at the low frequency extremity of the high frequency band, and thus to define the limit of channel 7, a lumped capacitance 38, in the form of a small condenser, is shunted between the conductors 28 and 30 at a point adjacent the inductances 24 and 26; that is, at a point near the left end of the line. This capacitance will have little effect when the slider 32 is at the left end of its extremity, but as the slider moves to the right, the capacitance 38 will become increasingly effective since it will shunt a larger and larger percentage of the total inductance of the line, and when the slider reaches the point corresponding to the low-frequency extremity of the higher frequency range, the capacitance 38 will be the primary factor in determining the limiting frequency. This capacitance is preferably made slightly adjustable in order to enable the lower limit of frequency at the low frequency end of the higher frequency range to be set without disturbing the values of frequency obtained at intermediate points.

When the slider 32 moves to the right of the lumped inductances 36, the natural frequency of the line will be altered by a large amount, sufficient to place the frequency at the value required for channel 6. A slight adjustment (fine tuning) of this frequency is permitted by the variation in line inductance and capacity as the slider moves along the straight portion 40 corresponding to channel 6; as the slider moves past the next inductive loop 34 the natural frequency is changed approximately the six megacycles required to resonate the circuit at the channel 5 frequency, and so on throughout the remaining low-frequency channels. (The last channel, channel 1, may be omitted from consideration if desired since it is not at present used for commercial television operations.)

In order to establish the lower limit of frequency to which the line will be tuned with the slider 32 at its extreme right hand position, a small and preferably slightly adjustable capacitance 42 is shunted between the conductors 28 and 30 at a point adjacent to the inductances 36; when the slide 32 is located near this capacitance 42, the capacitance will be effectively shorted and its adjustment will have little effect on the resonant frequency of the line. However, as the slide 32 is moved to the right, the effective capacitance 40 will progressively increase in the same manner as described above in connection with capacitance 38, and it will establish the minimum frequency obtained when the slide 32 is in its extreme right hand position.

Fig. 3 of the drawings illustrates in plan view a physical embodiment of a tuning unit in accordance with the principles outlined above, in which the various components of the tuned line have been arranged in a generally circular configuration for convenience of manufacture and in order to obtain a desirable space factor. Only one of the composite conductors corresponding to the line 28 and 30 of Fig. 2 is visible in Fig. 3, but it will be understood that the other conductor (which lies in a parallel position behind that shown in Fig. 3) is a duplicate of the one visible in that figure. The same reference numerals have been applied to Fig. 3 that were used in describing line 30 of Fig. 2, since these are in direct correspondence. The shorting bar or slide 32 is represented in Fig. 3 as mounted for rotation with a shaft 50 to which it is secured by an insulation arm 52; two contact springs secured to slide 32 thus travel in a circle upon which lie those surfaces of the conductive portions of the tuned line which the slide must engage to provide the tuning. In order to provide the desired variation in capacitance per unit length between the high frequency sections of the two parallel tuning plates, these latter are tapered on their inner surfaces as indicated at 54 in a manner suggested above. That portion of each tuner plate which corresponds to the low frequency bands 1 to 6 is formed of a single strip of metal having the reentrant or radially directed loops 34 which provide lumped inductance between the circumferential portions corresponding to each of the bands. It is clear that once the proper configuration of tuner plates or lines has been established for a desired application, the same may readily be stamped from a suitable sheet material, such as copper, to very close dimensional tolerances, thus providing accurate calibration and interchangeability of the unit. Fig. 4 of the drawings illustrates the Fig. 3 assembly in side elevation, and clearly illustrates the manner in which the two halves of the tuned line are arranged in parallel relation.

In order to simplify the assembly of the conductors which make up the tuned line into a rigid unit which will be free from microphonics and in which all parts will be held in the predetermined desired relationship to one another, the lines may be imbedded in a suitable low-loss plastic material, either cast in situ or more preferably formed by an assemblage of plastic discs, one lying between and one on either flat surface of the unit, as best shown in Fig. 5. In that figure, the tuned line conductors are again denominated by numerals 28 and 30 and are separated by a plastic insulating layer 56, an outer plastic insulating layer 58 being assembled in clamping relation on each side thereof and secured by cement, rivets, screws or in any other desired fashion.

The embodiment of the invention described above provides a tunable line particularly adapted to balanced or push-pull oscillators, amplifiers and the like. It is equally feasible, however, to provide a tunable line adaptable to single-ended or unbalanced operation, merely by substituting a ground plate for one of the duplicate line conductors of Fig. 2. This modification is illustrated schematically in Fig. 6 of the drawings, in which a ground line 60 has been substituted for the line 28 of Fig. 2. In all other respects, the assembly is cognate to that previously described and like reference characters have been used to designate the significant portions of the single tunable conductor 30.

In the physical embodiment corresponding to the schematic diagram of Fig. 6, the ground plate 60 may be merely a circular disc of conductive material assembled, as was conductor 28 of Fig. 5, in parallel spaced relationship to the tunable conductor 30. In such an embodiment, however, the stray capacitance between the tunable conductor and the ground plate may conveniently be controlled by varying the shape (that is the internal profile) of the ground plate in a manner illustrated in Fig. 7, in which portion 62 of the ground plate provides a relatively large stray capacitance for the high frequency end of the spectrum, and a portion or arm 64 of small effective area is arranged to cooperate with the tunable line at its low frequency end.

A further feature of the invention is illustrated schematically in connection with Fig. 6, numeral 65 denoting a resistive element connected from line 30 to ground plate 60, and thus providing a shunt resistance to enable control of the "Q" of the tuner. If, as shown in Fig. 6, this resistor 65 is located near the low frequency end of the tuned line, the effective "Q" will be lowered at the lower frequency where it normally rises, and as the shorting bar is adjusted to raise the resonant frequency of the line, and said bar passes the resistor 65, the latter is effectively out of the circuit. By proper choice of the number and value of the resistors employed in this way, a uniform value of "Q" may be maintained over a relatively wide frequency band. Furthermore, in coupling between two sets of rings by either capacitive or magnetic coupling, the coupling co-efficient may be similarly controlled, which is an important feature in applications where the tuning units are used in several stages which are to be coupled together, or in tunable band pass circuit arrangements. Clearly, the Q-controlling resistors such as element 65, and the controllable coupling connections just described will apply equally well to the forms of tuned lines illustrated in Figs. 2 to 5 of the drawing.

It will be obvious to those skilled in the art that the single tunable line assembly of Fig. 5 or Fig. 6 of the drawings must be multiplied in order to provide for the tuning of multiple or cooperating circuits; for example, three such units would be required to provide tuning for the radio frequency amplifier, local oscillator and mixer circuits of a usual form of television receiver. A convenient and economical method of producing such a multiple unit is illustrated schematically in Fig. 8 of the drawings in which three of the tunable line units designed 66 are mounted in fixed position with respect to a base or sub-base 68, and an insulating yoke 70 carrying three shorting bars or slider 72 is rotatably mounted coaxially with units 66 as by brackets 74. Simultaneous adjustment of the resonant frequency of the three units 66 is readily obtained by rotation of the single knob 74'. It is to be understood that the individual tuning units 66 are not necessarily duplicates, and in general will differ, for example, where one unit is employed to control a local oscillator frequency differing by a desired intermediate frequency from a carrier to which another of the units is to be tuned.

While I have illustrated herein certain preferred embodiments of the invention by way of example, it will be apparent that many changes in the physical embodiment may be made. For example, the conductive line sections may be formed other than by stamping from sheet material; they may be formed by spraying, printing or otherwise applying conductive material directly to the surface of a plastic support, such as one of the plastic discs shown in Fig. 5. Moreover, it is immaterial whether the tunable line sections are relatively fixed and the slider or shorting bar is moved, or the reverse arrangement is employed utilizing a fixed shorting bar and rotation of the tunable line units. These and other obvious mechanical changes are included within the spirit of my invention as defined in the appended claims.

I claim:

1. A tuning unit comprising a parallel conductor transmission line arranged in circular configuration, inductance controlling elements connected in series along said line at spaced points, capacitance controlling elements shunting said conductors at spaced points, and a movable shorting element for shorting said conductors to one another along said line.

2. A tuning unit comprising a pair of conductors arranged in parallel planes about a common central axis perpendicular to said planes, each conductor comprising a first arcuate section of varying dimensions in the direction toward said axis, and a second arcuate section defining a series of concentric arcuate conductor elements separated by inductance elements joined to the adjacent ends of adjoining conductor elements; means movable continuously over the said first arcuate section and the said series of concentric elements and electrically connecting the said conductors to each other.

3. A tuning unit comprising a parallel conductor transmission line arranged in circular configuration, inductance controlling elements connected in series along said line at spaced points, capacitance controlling elements shunting said conductors at spaced points, a movable shorting element for shorting said conductors to one another along said line, and resistive means connected across said conductors at predetermined points along the length thereof.

4. A tuning unit comprising a pair of conductors arranged in parallel planes about a common central axis perpendicular to said planes, each conductor comprising a first arcuate section of varying dimensions in the direction of said axis and a second arcuate section defining a series of concentric arcuate conductor elements separated by inductance elements joined to the adjacent ends of adjoining conductor elements, and resistive means connected across said conductors at predetermined points along the length thereof; means movable continuously over the said first arcuate section and the said series of concentric elements and electrically connecting the said conductors to each other.

5. A tuning unit comprising a parallel conductor transmission line each conductor thereof comprising conductor sections of smooth, unbroken configuration extending generally in a predetermined path and inductive loop sections formed integral with said conductor sections between successive conductor sections, said loop sections extending in directions lateral to said predetermined path, and means for short-circuiting said conductors at an adjustable distance along said line.

6. A tuning unit comprising a parallel conductor transmission line each conductor thereof comprising conductor sections of smooth, unbroken configuration extending generally in a predetermined path and inductive loop sections formed integral with said conductor sections between successive conductor sections, said loop sections extending in directions lateral to said predetermined path, and means for selectively connecting corresponding conductor sections of said respective conductors to one another at points variably disposed intermediate the ends of said conductor sections.

7. A tuning unit comprising a pair of conductive strips disposed parallel to one another and each arranged in a generally arcuate configuration, portions of each of said strips deviating from their arcuate directions to provide integral inductive loops extending generally towards the centers of their respective arcs, and a shorting element arranged for rotation about the common central axis of said strips for connecting said strips to one another at an adjustable distance from their ends.

8. A tuning unit comprising a system of parallel conductors, a portion of said parallel conductors consisting of a distributed parameter line, a second portion of said conductors comprising sections of a distributed parameter line, lumped inductances interposed between said sections and an element movable continuously over said distributed line portions and sections and short circuiting said conductors at various distances along said system.

9. A tuning unit comprising a system of parallel conductors, at least one of said conductors having a portion with uniformly distributed parameters and sections having uniformly distributed parameters, lumped inductance elements interposed between said sections, means movable continuously over said uniformly distributed parameter portion and sections short circuiting said conductors at a variable distance from one end of said system.

10. A tuning unit comprising a distributed parameter line and sections of a line having distributed parameters, inductive elements connected in series between said line and one of said line sections and between said line sections, each of said line and line sections comprising two conductors arranged in parallel relationship to each other and being of substantially circular configuration, a movable shorting element for continuously connecting said two conductors together at various distances from one end of said line.

11. A tuning unit for tuning at preselected frequencies and fine tuning around said frequencies comprising a portion of a distributed parameter line and sections of a line having distributed parameters, lumped parameters being interposed between said line and said sections and between said sections, an element movable continuously over the said line for short circuiting said line and tuning said unit at preselected frequencies and around said frequencies continuously.

12. A tuning unit for tuning at preselected frequencies and fine tuning around said frequencies comprising a portion of a distributed parameter line and sections of a line having distributed parameters, lumped parameters being interposed between said line and said sections and between said sections, an element movable continuously over the said sections for short circuiting said sections and fine tuning said unit between preselected frequencies.

13. A tuning unit comprising a system of parallel conductors, a portion of said parallel conductors consisting of a distributed parameter line, a second portion of said conductors comprising sections of a distributed parameter line, lumped inductances interposed between said sections and an element movable continuously over said distributed line portions and sections and short circuiting said conductors at various distances along said system, resistive means connected across said conductors at predetermined points along the length thereof.

14. A tuning unit comprising a system of parallel conductors, at least one of said conductors having a portion with uniformly distributed parameters and sections having uniformly distributed parameters, lumped inductance elements interposed between said sections, and means movable continuously over said uniformly distributed parameter portion and sections short circuiting said conductors at a variable distance from one end of said system, resistive means connected across said conductors at predetermined points along the length thereof.

15. A tuning unit comprising a distributed parameter line and sections of a line having distributed parameters, inductive elements connected in series between said line and one of said line sections and between said line sections, each of said line and line sections comprising two conductors arranged in parallel relationship to each other and being of of substantially circular configuration, a movable shorting element for continuously connecting said two conductors together at various distances from one end of said line, resistive means connected across said line and said sections at predetermined points along the length thereof.

16. A tuning unit for tuning at preselected frequencies and fine tuning around said frequencies comprising a portion of a distributed parameter line and sections of a line having distributed parameters, lumped parameters being interposed between said line and said sections and between said sections, an element movable continuously over the said line for short circuiting said line and tuning said unit at preselected frequencies and around said frequencies continuously, resistive means connected across said line and said sections at predetermined points along the length thereof.

17. A tuning unit for tuning at preselected frequencies and fine tuning around said frequencies comprising a portion of a distributed parameter line and sections of a line having distributed parameters, lumped parameters being interposed between said line and said sections and between said sections, an element movable continuously over the said sections for short circuiting said sections and fine tuning said unit between preselected frequencies, resistive means connected across said line and said sections at predetermined points along the length thereof.

18. A tuning unit comprising a distributed parameter line and sections of a line having distributed parameters, inductive elements connected in series between said line and one of said line sections and between said line sections, each of said line and line sections comprising two conductors arranged in parallel relationship to each other and being of substantially circular configuration, a movable shorting element for continuously connecting said two conductors together at various distances from one end of said line, resistive means connected across said line sections at predetermined points along the length thereof.

19. A tuning unit for tuning at preselected frequencies and fine tuning around said frequencies comprising a portion of a distributed parameter line and sections of a line having distributed parameters, lumped parameters being interposed between said line and said sections and between said sections, an element movable continuously over the said line for short circuiting said line and tuning said unit at preselected frequencies and around said frequencies continuously, resistive means connected across said line sections at predetermined points along the length thereof.

20. A tuning unit for tuning at preselected frequencies and fine tuning around said frequencies comprising a portion of a distributed parameter line and sections of a line having distributed parameters, lumped parameters being interposed between said line and said sections and between said sections, an element movable continuously over the said sections for short circuiting said sections and fine tuning said unit between preselected frequencies, resistive means connected across said line sections at predetermined points along the length thereof.

References Cited in the file of this patent

UNITED STATES PATENTS

| | | |
|---|---|---|
| 1,018,874 | Campos | Feb. 27, 1912 |
| 1,837,327 | Lewis | Dec. 22, 1931 |
| 2,262,365 | Kinn | Nov. 11, 1941 |
| 2,292,254 | Van Beuren | Aug. 4, 1942 |
| 2,370,423 | Roberts | Feb. 27, 1945 |
| 2,409,542 | Carter | Oct. 15, 1946 |
| 2,411,555 | Rogers | Nov. 26, 1946 |
| 2,453,489 | Bruntil | Nov. 9, 1948 |
| 2,475,198 | Reinschmidt | July 5, 1949 |
| 2,513,392 | Aust | July 4, 1950 |
| 2,527,608 | Willoughby | Oct. 31, 1950 |
| 2,539,905 | Herbst | Jan. 30, 1951 |
| 2,551,228 | Achenbach | May 1, 1951 |

OTHER REFERENCES

Terman's "Radio Engineering," published by McGraw-Hill Book Co., New York, second edition, 1937, page 30. (Copy available at Library of Congress, Washington, D. C.)

RCA Victor Television Receiver Model 630 TS Service Data by the Radio Corporation of America, RCA Victor Division, Camden, New Jersey, copyright July 16, 1947. (Copy in Div. 16.)